(12) United States Patent
Gunawan et al.

(10) Patent No.: US 10,923,132 B2
(45) Date of Patent: Feb. 16, 2021

(54) DIFFUSIVITY BASED SOUND PROCESSING METHOD AND APPARATUS

(71) Applicant: Dolby Laboratories Licensing Corporation, San Francisco, CA (US)

(72) Inventors: David Gunawan, Sydney (AU); Chunjian Li, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 250 days.

(21) Appl. No.: 16/073,663

(22) PCT Filed: Feb. 15, 2017

(86) PCT No.: PCT/US2017/017922
§ 371 (c)(1),
(2) Date: Jul. 27, 2018

(87) PCT Pub. No.: WO2017/142916
PCT Pub. Date: Aug. 24, 2017

(65) Prior Publication Data
US 2019/0088264 A1 Mar. 21, 2019

Related U.S. Application Data

(60) Provisional application No. 62/309,388, filed on Mar. 16, 2016.

(30) Foreign Application Priority Data

Feb. 19, 2016 (WO) ............... PCT/CN2016/074106
Mar. 23, 2016 (EP) ................................... 16161825

(51) Int. Cl.
*G10L 19/00* (2013.01)
*G10L 19/008* (2013.01)
(Continued)

(52) U.S. Cl.
CPC .......... *G10L 19/008* (2013.01); *G10L 21/034* (2013.01); *H03G 3/3005* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 6,674,865 | B1 | 1/2004 | Venkatesh |
| 8,315,400 | B2 | 11/2012 | Goldstein |

(Continued)

FOREIGN PATENT DOCUMENTS

| | | |
|---|---|---|
| CN | 104579212 | 4/2015 |
| RS | 20060611 | 6/2007 |

(Continued)

OTHER PUBLICATIONS

Vilkamo, Juha. et al "Directional Audio Coding: Virtual Microphone-Based Synthesis and Subjective Evaluation", Sep. 9, Audio Education Society, JAES vol. 57 Issue 9, pp. 709-724.

(Continued)

*Primary Examiner* — Vu B Hang

(57) ABSTRACT

A sound processing system operative to measure the level of diffusivity of the sounds present in the input sound signal. The system includes a plurality of input channels for receiving audio signals from an audio scene, the audio scene comprising at least one target sound in the presence of background noise. A diffusivity measurement unit is included so as to be operably coupled to the plurality of input channels to receive the audio signals therefrom and measure a level of diffusivity of the sounds present therein. A leveler unit is operably coupled to the plurality of input channels for receiving the audio signals therefrom and for applying a gain to the audio signals to minimize variations (Continued)

in the audio signal levels. A controller is operably coupled to the diffusivity measurement unit and the leveler unit to control the gain applied to the audio signals by the leveler unit based on the level of diffusivity of the sounds present therein.

23 Claims, 3 Drawing Sheets

(51) Int. Cl.
    *G10L 21/034*     (2013.01)
    *H03G 3/30*     (2006.01)
    *H03G 3/34*     (2006.01)
    *H03G 5/00*     (2006.01)
    *H04R 5/04*     (2006.01)
    *H04S 7/00*     (2006.01)
    *H03G 5/16*     (2006.01)
    *H03G 3/32*     (2006.01)

(52) U.S. Cl.
    CPC ............. *H03G 3/3089* (2013.01); *H03G 3/32* (2013.01); *H03G 3/344* (2013.01); *H03G 5/005* (2013.01); *H03G 5/165* (2013.01); *H04R 5/04* (2013.01); *H04S 7/30* (2013.01); *H04R 2430/01* (2013.01); *H04S 7/00* (2013.01); *H04S 2400/13* (2013.01); *H04S 2400/15* (2013.01); *H04S 2420/07* (2013.01)

(56) References Cited

U.S. PATENT DOCUMENTS

| | | |
|---|---|---|
| 8,473,287 B2 | 6/2013 | Every |
| 8,682,006 B1 | 3/2014 | Laroche |
| 8,913,761 B2 | 12/2014 | Shin |
| 8,958,572 B1 | 2/2015 | Solbach |
| 9,014,382 B2 | 4/2015 | Van De Par |
| 2013/0142341 A1 | 6/2013 | Del Galdo |
| 2013/0325458 A1 | 12/2013 | Buck |
| 2014/0112483 A1 | 4/2014 | Etter |
| 2014/0112496 A1 | 4/2014 | Murgia |
| 2014/0233762 A1 | 8/2014 | Vilkamo |
| 2014/0241528 A1 | 8/2014 | Gunawan |
| 2015/0063599 A1 | 3/2015 | Ring |

FOREIGN PATENT DOCUMENTS

| | | |
|---|---|---|
| WO | 2007/0127023 | 11/2007 |
| WO | 2008/0041321 | 4/2008 |
| WO | 2014/0046941 | 3/2014 |
| WO | 2015/0086377 | 6/2015 |
| WO | 2015/0130283 | 9/2015 |
| WO | 2016/0011048 | 1/2016 |

OTHER PUBLICATIONS

Thiergart, O. et al "Power-based signal-to-diffuse ratio estimation using noisy directional microphones", May 4-9, 2014, IEEE International Conference May 4-9, 2014, pp. 7440-7444.

Dickins, G. et al "On the Spatial Localization of a Wireless Transmitter from a Multisensor Receiver" Signal Processing and Communication Systems, 2008.

DIFFUSIVITY BASED SOUND PROCESSING METHOD AND APPARATUS

TECHNOLOGY

The present disclosure relates generally to a system and method for processing an audio scene, and more particularly, to a system and method for processing an audio scene that enhances signals of interest present within the audio scene using a diffusivity measure.

BACKGROUND

An audio scene generally includes a multi-dimensional environment in which different sounds emanate from different sources at various levels and locations. An example of an audio scene may be a restaurant, theatre, concert hall or any indoor or outdoor venue where sound may occur at different positions and times.

Audio scenes are often recorded using devices with multiple microphones for a variety of different reasons. Such devices may be in the form of mobile phones, tablets and the like that capture the audio scene by recording the scene for storage and later playback or for transmission. The captured audio signals are typically processed prior to transmission or playback, in accordance with a variety of rendering algorithms to enhance the audio scene so as to actively adjust the levels of different segments of the audio signal.

Conventional levelling systems employed by audio processing systems employ Automatic Gain Control (AGC), to regulate the levels of the audio signals in the captured audio scene. The function of AGC is to automatically adjust the level of the recorded audio signals so that soft sound signals are amplified in level to become, while hard sounds are attenuated or reduced in level to provide a more comfortable listening experience. As such, most AGCs are steered by a level estimator that estimates the level of the captured audio signal.

A problem with most simple AGCs is that in some situations they can function to boost the presence of any background noise in the audio scene. In an audio scene where audio signal of interest is a voice of a speaker in the presence of a low level background noise, during periods where the speaker may pause, the AGC typically boosts the background noise thereby significantly reducing the quality of the audio recording or transmission.

To address this problem, many AGCs employ a noise gating function that detects the expected background noise level present in the audio scene relative to the peak signal level of the audio scene. Any audio signal that falls below the expected background noise level are excluded from an AGC gain change to avoid the background noise from being unnecessarily amplified during periods of silence in a conversation or speech.

However, a problem with such a general noise gating approach is that it is often difficult to simply distinguish sounds of interest from background noise purely based on a comparison of the level of the detected sound signal. For example, if a speaker reverts to delivering a speech or conversation in a softer whisper, rather than amplifying the sound signal for enhanced intelligibility, the AGC may not be able to distinguish such a sound signal from background noise, thereby failing to apply necessary amplification to the sound signal. Also, depending upon the audio scene, levels of background noise may vary considerably within an audio scene and between audio scenes. As such, traditional noise gating systems can function to amplify background noise that is above the expected background noise level, thereby degrading that quality of the recording or transmission of the audio scene.

DESCRIPTION OF THE DRAWINGS

The present disclosure is illustrated by way of example, and not by way of limitation, in the figures of the accompanying drawings and in which like reference numerals refer to similar elements.

DETAILED DESCRIPTION

Overview

Figure 1:
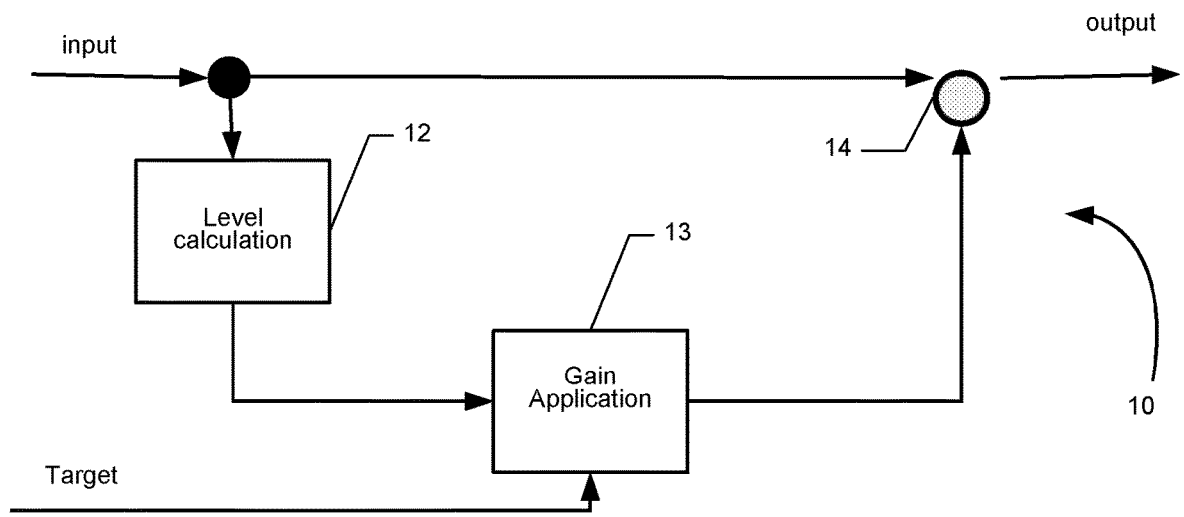
FIG. 1 shows a simplified system depicting a conventional AGC leveling system in accordance with known systems.

Described herein are a sound processing system that includes a diffusivity measurement unit, a diffusivity based sound processing method and a computer-readable non-transitory machine-readable medium that includes instructions that causes the apparatus containing one or more processing engines to implement the diffusivity based sound processing method. The sound processor system includes logic operative to determine a diffusivity measurement of an input sound signal and to apply leveling of the sound signal in accordance with the level of diffusivity of the sound signal.

Particular embodiments include a sound processing system operative to measure the level of diffusivity of the sounds present in the input sound signal. The system includes a plurality of input channels for receiving audio signals from an audio scene, the audio scene including at least one target sound in the presence of background noise. A diffusivity measurement unit is included so as to be operably coupled to the plurality of input channels to receive the audio signals therefrom and measure a level of diffusivity of the sounds present therein. A leveler unit is operably coupled to the plurality of input channels for receiving the audio signals therefrom and for applying a gain to the audio signals to minimize variations in the audio signal levels. A controller is operably coupled to the diffusivity measurement unit and the leveler unit to control the gain applied to the audio signals by the leveler unit based on the level of diffusivity of the sounds present therein.

In a particular set of embodiments, the level of diffusivity of the sound present in the audio signal is determined as a value between 0 and 1, with 0 representing a sound which is purely directional and 1 representing a sound that is totally diffuse.

In a particular set of embodiments, the controller compares the determined value representative of the level of diffusivity of the sound present in the audio signal against a predetermined threshold value and if the determined value is greater than the predetermined threshold value, the level of diffusivity of the sounds present within the audio signal is determined as being high and the no gain is applied to the audio signal by the leveler unit.

In a particular set of embodiments the controller compares the determined value representative of the level of diffusivity of the sound present in the audio signal against a predetermined threshold value and if the determined value is lower than the predetermined threshold value, the level of diffusivity of the sounds present within the audio signal is determined as being low and gain is applied to the audio signal by the leveler unit.

In a particular set of embodiments the controller employs the determined value representative of the level of diffusivity of the sound present in the audio signal to vary a timing function of the leveler unit.

In a particular set of embodiments the plurality of input channels is generated by one or more microphone units present within the audio scene. The audio signals received from the plurality of input channels are passed through a bandpass filter to generate a plurality of bands for each frame of the audio signal.

In a particular set of embodiments the diffusivity measurement unit calculates a covariance matrix for each of the plurality of bands of each frame of the audio signal. The diffusivity measurement unit further processes the covariance matrix by performing an eigen decomposition function to obtain the level of diffusivity of each band of the frame of audio signal.

In a particular set of embodiments a broadband diffusivity measure is generated by the diffusivity measurement system for each frame of audio signal by summing the level of diffusivity for each band in the frame of audio signal and this broadband diffusivity measure is supplied to the controller to control the gain applied to the frame of audio signal by the leveler unit.

In a particular set of embodiments the level of diffusivity of each band of the frame of audio signal is supplied to the controller to control the gain applied to the bands of the frame of audio signals by the leveler unit.

In a particular set of embodiments the leveler unit is an Automatic Gain Control (AGC) circuit.

Particular embodiments include a diffusivity based sound processing method in a sound processing system that includes a diffusivity measurement unit and processing hardware. The method includes processing an audio signal comprising at least one target sound in the presence of background noise, including receiving the audio signals from a plurality of input channels, band filtering the audio signals to create a plurality of individual frequency bands forming a segment of the audio signal, calculating a diffusivity measurement for the sound present in each individual frequency band and processing the calculated diffusivity measurements to determine a level of diffusivity for the segment of audio signal, comparing the level of diffusivity for the segment of audio signal against a predetermined level to determine whether the segment of audio signal contains diffuse sound. In the event that the level of diffusivity of the segment is below the predetermined level, applying levelling to the segment of audio signal to minimize variations in the audio signal levels. In the event that the level of diffusivity of the segment is determined as being above the predetermined level, bypassing any levelling of the segment of audio signal and generating one or more output channels.

Other sets of the method embodiments include one or more of the aspects described herein for the apparatus embodiments.

Particular embodiments include a non-transitory machine-readable medium coded with instructions, that when executed by a processing system in a receiving endpoint, carry out any one of the above summarized methods.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Some Example Embodiments

FIG. 1 shows a block diagram of a simple conventional AGC leveling system 10 for processing an audio input obtained from an audio scene, in accordance with known systems. The input signal is firstly supplied to a level calculation subsystem 12 that performs level detection on the each segment of the input signal to identify an estimated sound level for each audio segment. The estimated sound level of the segment is then supplied to the gain application subsystem 13, which determines an updated gain for each audio segment by comparing the estimated sound level with a target level. If the gain application subsystem determines that the level of the sound segment requires modification, a gain is applied to the sound segment by amplifier/attenuator 14 such that each audio segment is shifted to a predetermined target level at the output of amplifier/attenuator 14.

In the conventional AGC levelling system 10 of FIG. 1, the level calculation subsystem 12 determines the estimated sound level of each audio signal segment, which is then used by the gain application subsystem 13 to determine whether the level is to be amplified or attenuated and by what amount, in comparison to a target level.

However, in devices that employ two or more microphones, such as mobile phones, tablets and the like, the data collected from the audio scene contains spatial information, such as the direction of the sound source should the signal be directional, or the diffusivity of the sound signal, if the sound is diffuse.

The diffusivity of an object represents the degree of how diffuse an audio scene gets when the sound is emitted, for example when a human speaks. Diffusivity is an indicator of the reverberation of the room or environment, and the distance the object source is from the microphone array. The diffusivity or similar feature can be defined and derived in many different ways. Such examples include:

assessing the eigenvalues of a short term estimation of the input signal covariance matrix, where the ratio of the first to subsequent eigenvalues is in indicator of the strength of the direct sound, utilizing the gradient of the power or signal amplitude in a given frequency band or bands, where a faster attack or decay is indicative of less diffuse or reverberant incident audio.

utilizing the spectral characteristics of a known or reasonably modeled source, where an attenuation of higher frequencies is related to the distance travelled by the direct and subsequent sound from the source, utilizing the level or aspects of estimated level for any source that can be known or well modeled, utilization of various ratios between cross correlation and autocorrelation terms, such as that obtained from a simple measure of correlation between input channels, with reverberant or distant sounds generally having less correlation at any compact microphone array, utilizing the difference in amplitude between microphones as an indicator of distance, for example as presented in (Dickins, Kennedy, "On the spatial localization of a wireless transmitter from a multisensor receiver", Signal Processing and Communication Systems, 2008. ICSPCS 2008, the entire contents of which are incorporated herein by reference).

One example of how a diffusivity level of a sound signal may be calculated is described in the present applicant's co-pending U.S. Patent Publication No. 2014/0241528, the entire contents of which are incorporated herein by reference.

The diffusivity of the signal may have a value of between 0-1. The value may be 0 if the sound is purely directional, or 1 is the sound is totally diffuse. As such, the diffusivity measure is a reciprocal measure of directivity measure, which is also known as purity measure. As will be discussed in more detail below, the sensitivity of the example embodiment may be established by setting a predetermined diffusivity value 'x' that establishes the degree of diffusivity of the signal that is to be tolerated. An 'x' value of 0.3 may be set where the system is used in an acoustic scene having a typically high degree of diffuse background noise, whilst a higher value may be employed in acoustic scenes where diffuse background noise is less prevalent.

It has been found that the diffusivity measure of an audio scene correlates well with the determination of an activity of interest within that acoustic scene. In this regard, sound signals that originate from a location nearby the recording microphones of the device typically tend to be less diffuse than sound signals that originate from a more remote location within the audio scene. This can be attributed to the fact that the signal from the closer source typically has a higher direct-to-reverb ratio than the remote source. Further in most recoding situations, the activity of interest that generates the desired sound signal is typically placed closer to the microphones of the recording device when compared to the sources of the background noise. Also, as the human auditory system is generally more sensitive to directional sound than diffuse sound, it is considered that directional sound is able to carry more information and as a result, should be given a larger weighting during the processing of the signal.

Figure 2:
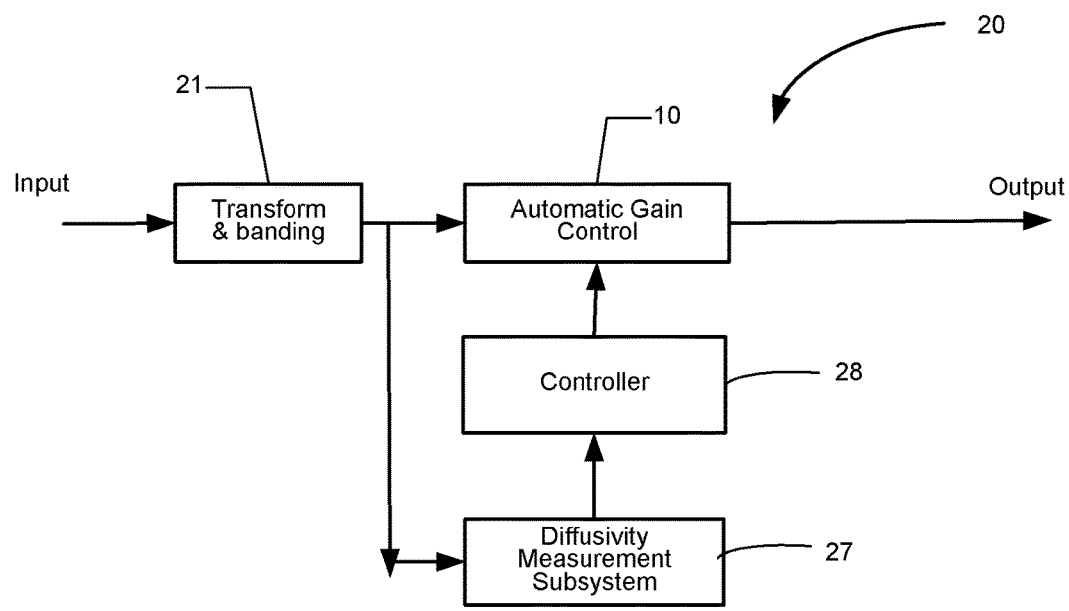
FIG. 2 shows in simplified system of a diffusivity based processing system in accordance with an example embodiment.

On the basis of the above understanding, an embodiment is depicted in FIG. 2 as diffusivity based processing system 20. In this embodiment, the diffusivity based processing system 20 utilizes a diffusivity measurement of the input signal either in isolation or in combination with a conventional AGC 10 direct to determine the amount of gain to be applied to the sound segments of the input signal. In its simplest form, the diffusivity measurement subsystem 27 of the diffusivity based processing system 20 functions as a gate to control the AGC 10 to control the gain applied to the sound segments, such that only in conditions where the sound segments are determined as being below a threshold level, therefore indicative of emanating from a directional sound source, is the gain applied to the sound segment.

The diffusivity based processing system 20, includes a transform and banding subsystem 21 that transform the input sound signal received from the (n) input channels (typically microphone inputs) into sound segments for further processing. Each of the sound segments are then banded by passing the segments through a band pass filter to generate individual frequency bands (b), with the transform and banding subsystem 21 generating (n) channels×(b) bands.

Each of the bands (b) are then passed through the diffusivity measurement subsystem 27 which calculates a diffusivity measure for each band in accordance with a number of known methods for each signal processing frame, as will be discussed in more detail below. If the diffusivity measure for the signal processing frame is determined as being above a predetermined level (x), the controller 28 emits a signal to the AGC 10 to exclude that signal processing frame from calculation such that no amplification or attenuation is applied to that signal processing frame. Conversely, if the diffusivity measure for that signal processing frame is determined by the diffusivity measurement subsystem 27 to be below the predetermined level (x), the controller 28 indicates to the AGC 10 that levelling of the signal is to be performed by the AGC in the conventional manner, as discussed in relation to FIG. 1. In this regard, the controller 28 does not interfere with the AGC gain adjustments during periods where the signal processing frame contains sound determined to be from a directional source rather than a diffuse source.

In a variation of the above process, the controller 28 may be configured to receive the calculated diffusivity measure from the diffusivity measurement subsystem 27, and even if the diffusivity measure is above the predetermined level (x), if the level of the signal processing frame is higher than a predetermined comfortable level, the controller requests the AGC 10 to apply attenuation to the signal processing frame to bring the level down to an acceptable level. This occurs despite the signal processing frame being representative of a diffuse sound. Further, if the calculated diffusivity measure from the diffusivity measurement subsystem 27 is below the predetermined level (x) and the signal level is low, the controller 28 will direct the AGC 10 to facilitate proper levelling of the soft sound in accordance with the settings of the AGC 10.

In another variation of the above process, rather than assessing the diffusivity measurement against a threshold measurement, the diffusivity measurement of the input signal may be used to drive a function that influences the time constant of the AGC or leveler. In this regard, most AGCs or levelers typically employ a hold time function to assess the level of the signal and apply the necessary amplification or attenuation to the signal. By using the diffusivity measurement, the time constant could be adjusted based on the degree of diffusivity of the signal.

Figure 3:
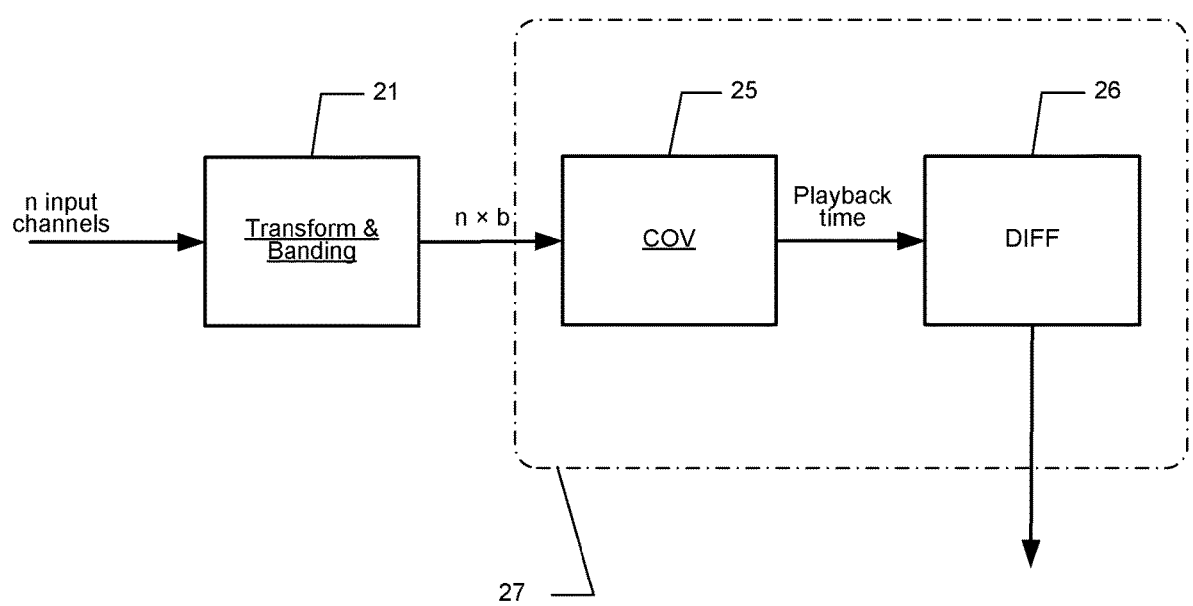
FIG. 3 shows a simplified block diagram of an embodiment of a diffusivity measurement subsystem.

As depicted in FIG. 3, in accordance with an example embodiment, the diffusivity measurement subsystem 27 may be configured as shown to calculate the diffusivity measure. In this regard, for each signal frame at each frequency band (b), a first diffusivity processor 25 calculates covariance matrices for each of the bands (b) of dimension n×n, where n is the number of channels (microphones). The second diffusivity processor 26 then calculates a diffusivity measure by performing eigen decomposition function on the generated covariance matrices, by summing the power of the off-diagonal elements of the covariance matrix and dividing that sum, by the sum of the power of the diagonal elements multiplied by 2. The resulting measurement is a value between 0 and 1, with a value of 1 representing that the sound signal is from a purely diffuse sound source, and a value of 0 indicating that the sound is from a purely directional sound source.

In a first example embodiment, diffusivity is calculated in each sub-band and then summed to provide a broadband diffusivity measure with the gain applied to the combined signal processing frame, depending upon the diffusivity measure obtained. However, in an alternative embodiment, the diffusivity measure may be calculated in each sub-band, and the gain adaptation and application may also be implemented in each sub band as well. As such, the diffusivity based processing system 20 of FIG. 2 could be employed in a banded or broadband domain, and could be applied in a short or long time constant (e.g. AGC or Leveler application).

Figure 4:
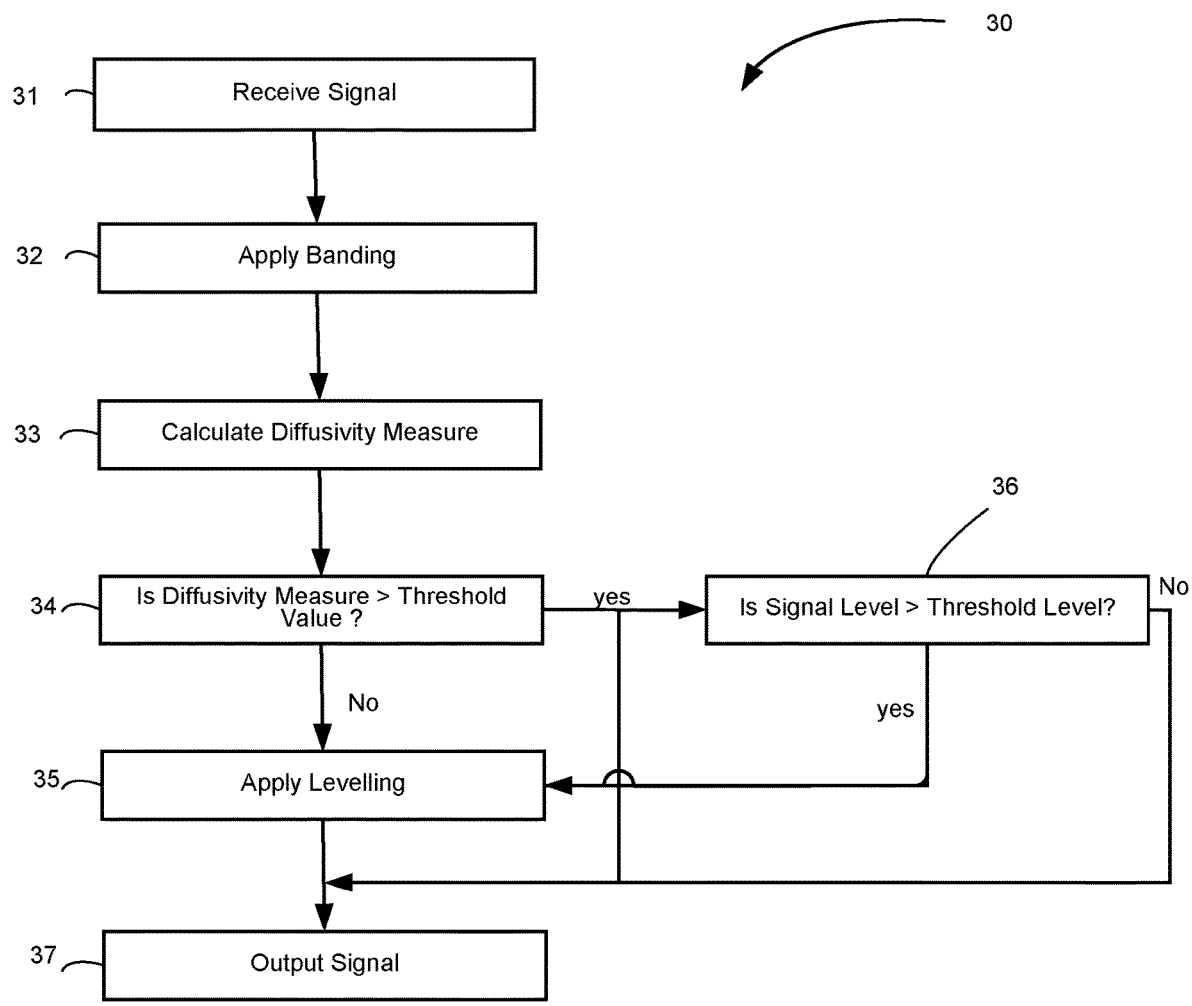
FIG. 4 shows a simplified flowchart of a method of an example embodiment.

Referring to FIG. 4, a method 30 for diffusivity based sound processing is shown in accordance with an example embodiment.

At step 31, the signal is received through the microphones of the recording device located in the audio scene capturing the sound signal. By way of example, the recording device may be a mobile telephone and the audio scene may be an outdoor concert and the user may wish to record the performer performing at the concert. In this situation the sound signal may include the performance as well as background noise, such as people in the audience talking or cheering as well as other environmental noise.

At step 32, the received signal(s) is/are transformed and banded is applied to the signals to separate the signal into individual frequency bands associated with individual segments of the captured sound.

At step 33, each of the frequency bands are processed to determine a measure of diffusivity of sound present in that band, in accordance with the above described methods. The diffusivity measure may be calculated by summing up each of the frequency bands in a sound segment to provide a broadband diffusivity measure or may be calculated for each band separately.

At step 34, the diffusivity measure for the individual bands or the broadband segment is assessed against a predetermined threshold value. The predetermined value may be set depending upon the audio scene being recorded, to establish a level of diffusivity that is acceptable. If the calculated diffusivity measure is below the predetermined value, the AGC or leveler is able to process the individual band or broadband sound segment to attenuate or amplify the sound signal in accordance with the detected level of the sound signal in step 35.

If, at step 34, the diffusivity measure for the individual band or the broadband segment is determined to be above the predetermined value, the individual band or the broadband segment may bypass the levelling step 35 such that no levelling is applied to that individual band or broadband segment, or the levelling step may be performed using a gain value of 1, which also would result in no levelling being applied to that individual band or broadband segment. Alternatively, if a level of sound detected in the individual band or the broadband segment is above a predetermined comfort level as determined in step 36, the individual band or broadband segment may have levelling applied in levelling step 35, to attenuate the level of the individual band or the broadband segment to a more comfortable output level as depicted by step 37.

It will be appreciated that the method 30 may be further adapted in another embodiment to process background noise to facilitate the attenuation of background noise present in an audio scene. As previously discussed, sounds with low diffusivity often contain more useful information than sounds with high diffusivity. As such, in audio scenes with high levels of background noise, such as restaurants, parties, stadiums and the like, it is desirable to, rather than ignore such sounds, suppress the diffuse background sound in order to improve intelligibility of the foreground noise source.

In this variation of the method 30, the assessment step 34 may be varied such that for each individual band or broadband segment where the diffusivity measure is above the predetermined value, the individual band or the broadband segment may be directed to the levelling step 35 to enable the sound signal to undergo attenuation in proportion with the calculated diffusivity measure. In such a variation, the higher the diffusivity level of the individual band or the broadband segment, the larger the attenuation of the individual band the broadband segment. In this embodiment, the attenuations may be applied to each time-frequency tile which is then inversely transformed back into the time domain.

General

Unless specifically stated otherwise, as apparent from the following discussions, it is appreciated that throughout the specification discussions utilizing terms such as "processing," "computing," "calculating," "determining" or the like, refer to the action and/or processes of a host device or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, for example, may be stored in registers and/or memory.

The methodologies described herein are, in one embodiment, performable by one or more processors that accept machine-readable instructions, for example, as firmware or as software, that when executed by one or more of the processors carry out at least one of the methods described herein. In such embodiments, any processor capable of executing a set of instructions (sequential or otherwise) that specify actions to be taken may be included. Thus, one example is a programmable digital signal processor (DSP) device. Another is the CPU of a microprocessor or other computer-device, or the processing part of a larger application specific integrated circuit (ASIC). A processing system may include a memory subsystem including main RAM and/or a static RAM, and/or ROM (each of these being an example of a non-transitory computer-readable medium). A bus subsystem may be included for communicating between the components. The processing system further may be a distributed processing system with processors coupled wirelessly or otherwise, e.g., by a network. If the processing system requires a display, such a display may be included. The processing system in some configurations may include a sound input device, a sound output device, and a network interface device. The memory subsystem thus includes a machine-readable non-transitory medium that is coded with, for example, has stored therein a set of instructions to cause performing, when executed by one or more processors, one of more of the methods described herein. Note that when the method includes several elements, e.g., several steps, no ordering of such elements is implied, unless specifically stated. The instructions may reside in the hard disk, or may also reside, completely or at least partially, within the RAM and/or other elements within the processor during execution thereof by the system. Thus, the memory and the processor also constitute the non-transitory machine-readable medium with the instructions.

Furthermore, a non-transitory machine-readable medium may form a software product. For example, it may be that the instructions to carry out some of the methods, and thus form all or some elements of the inventive system or apparatus, may be stored as firmware. A software product may be available that contains the firmware, and that may be used to "flash" the firmware.

Note that while some diagram(s) only show(s) a single processor and a single memory that stores the machine-readable instructions, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a non-transitory machine-readable medium coded with, for example, having stored therein a set of instructions for execution on one or more processors, for example, one or more processors that are part of the receiver forming a pen stroke capture system.

Note that, as is understood in the art, a machine with application-specific firmware for carrying out one or more aspects of the invention becomes a special purpose machine that is modified by the firmware to carry out one or more aspects of the invention. This is different from a general purpose processing system using software, as the machine is especially configured to carry out the one or more aspects. Furthermore, as would be known to one skilled in the art, if the number the units to be produced justifies the cost, any set of instructions in combination with elements such as the processor may be readily converted into a special purpose ASIC or custom integrated circuit. Methodologies and software have existed for years that accept the set of instructions and particulars of the processor used in a design, and automatically or mostly automatically great a design of special-purpose hardware, e.g., generate instructions to modify a gate array or similar programmable logic, or that generate an integrated circuit to carry out the functionality previously carried out by the set of instructions. While some general skill may be required to so generate the gate array or similar programmable logic, or an integrated circuit, those aspects are standard, and may be contracted to be realized using standard design methodologies once the design described herein is provided. Thus, as will be appreciated by those skilled in the art, embodiments of the present invention may be embodied as a method, an apparatus such as a special purpose apparatus, an apparatus such as a DSP device plus firmware, or a non-transitory machine-readable medium. The machine-readable carrier medium carries host device readable code including a set of instructions that when executed on one or more processors cause the processor or processors to implement a method. Accordingly, aspects of the present invention may take the form of a method, an entirely hardware embodiment, an entirely software embodiment or an embodiment combining software and hardware aspects. Furthermore, the present invention may take the form a computer program product on a non-transitory machine-readable storage medium encoded with machine-executable instructions.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a host device system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path that includes other devices or mechanisms along the path. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

Note that the claims attached to this description form part of the description, so are incorporated by reference into the description, each claim forming a different set of one or more embodiments.

Various aspects of the present invention may be appreciated from the following enumerated example embodiments (EEEs):

EEE 1. A sound processing system including:
 a plurality of input channels for receiving audio signals from an audio scene, the audio scene including at least one target sound in the presence of background noise;
 a diffusivity measurement unit operably coupled to the plurality of input channels for receiving the audio signals therefrom and measuring a level of diffusivity of the sounds present therein;
 a leveler unit operably coupled to the plurality of input channels for receiving the audio signals therefrom and for applying a gain to the audio signals to minimize variations in the audio signal levels; and
 a controller operably coupled to the diffusivity measurement unit and the leveler unit to control the gain applied to the audio signals by the leveler unit based on the level of diffusivity of the sounds present therein.

EEE 2. A sound processing system according to EEE 1, wherein the level of diffusivity of the sound present in the audio signal is determined as a value between 0 and 1, with 0 representing a sound which is purely directional and 1 representing a sound that is totally diffuse.

EEE 3. A sound processing system according to EEE 2, wherein the controller compares the determined value representative of the level of diffusivity of the sound present in the audio signal against a predetermined threshold value and if the determined value is greater than the predetermined threshold value, the level of diffusivity of the sounds present within the audio signal is determined as being high and the no gain is applied to the audio signal by the leveler unit.

EEE 4. A sound processing system according to EEE 2, wherein the controller compares the determined value representative of the level of diffusivity of the sound present in the audio signal against a predetermined threshold value and if the determined value is lower than the predetermined threshold value, the level of diffusivity of the sounds present within the audio signal is determined as being low and gain is applied to the audio signal by the leveler unit.

EEE 5. A sound processing system according to EEE 2, wherein the controller employs the determined value representative of the level of diffusivity of the sound present in the audio signal to vary a timing function of the leveler unit.

EEE 6. A sound processing system according to EEE 3, wherein the plurality of input channels is generated by one or more microphone units present within the audio scene.

EEE 7. A sound processing system according to EEE 1, wherein the audio signals received from the plurality of input channels are passed through a bandpass filter to generate a plurality of bands for each frame of the audio signal.

EEE 8. A sound processing system according to EEE 7, wherein the diffusivity measurement unit calculates a covariance matrix for each of the plurality of bands of each frame of the audio signal.

EEE 9. A sound processing system according to EEE 8, wherein the diffusivity measurement unit further processes the covariance matrix by performing an eigen decomposition function to obtain the level of diffusivity of each band of the frame of audio signal.

EEE 10. A sound processing system according to EEE 9, wherein a broadband diffusivity measure is generated by the diffusivity measurement system for each frame of audio signal by summing the level of diffusivity for each band in the frame of audio signal and this broadband diffusivity measure is supplied to the controller to control the gain applied to the frame of audio signal by the leveler unit.

EEE 11. A sound processing system according to EEE 9, wherein the level of diffusivity of each band of the frame of audio signal is supplied to the controller to control the gain applied to the bands of the frame of audio signals by the leveler unit.

EEE 12. A sound processing unit according to EEE 1, wherein the leveler unit is an Automatic Gain Control (AGC) circuit.

EEE 13. A method for processing audio signals obtained from an audio scene including at least one target sound in the presence of background noise, including:
 receiving the audio signals from a plurality of input channels;
 band filtering the audio signals to create a plurality of individual frequency bands forming a segment of the audio signal;
 calculating a diffusivity measurement for the sound present in each individual frequency band and processing the calculated diffusivity measurements to determine a level of diffusivity for the segment of audio signal;
 comparing the level of diffusivity for the segment of audio signal against a predetermined level to determine whether the segment of audio signal contains diffuse sound;
 in the event that the level of diffusivity of the segment is below the predetermined level, applying levelling to the segment of audio signal to minimize variations in the audio signal levels;
 in the event that the level of diffusivity of the segment is determined as being above the predetermined level, bypassing any levelling of the segment of audio signal; and
 generating one or more output channels.

EEE 14. A method according to EEE 13, wherein the audio signals are received from one or more microphone units present within the audio scene.

EEE 15. A method according to EEE 13, wherein the step of calculating the diffusivity measurement for the sound present in each frequency band includes generating a covariance matrix for each individual frequency band and performing eigen decomposition on the generated covariance matrices.

EEE 16. A method according to EEE 15, wherein the level of diffusivity for the segment of audio signal includes summing the calculated diffusivity measurement in each individual frequency band to generate a broadband level of diffusivity for the segment of audio signal.

EEE 17. A method according to EEE 13, wherein the levelling is applied to the segment of audio signal by an AGC circuit.

EEE 18. A computer readable storage medium comprising software instructions, which when executed by one or more processors cause performance of any one of the methods recited in EEEs 13-17.

EEE 19. A non-transitory machine-readable medium coded with instructions, that when executed by a processing system in a receiving endpoint, carry out any one of the methods recited in EEEs 13-17.

The invention claimed is:

1. A sound processing system including:
    a plurality of input channels for receiving audio signals from an audio scene, the audio scene including at least one target sound in the presence of background noise;
    a diffusivity measurement unit operably coupled to the plurality of input channels for receiving the audio signals therefrom and measuring a level of diffusivity of the sounds present therein;
    a leveler unit operably coupled to the plurality of input channels for receiving the audio signals therefrom and for applying a gain to the audio signals to minimize variations in the audio signal levels; and
    a controller operably coupled to the diffusivity measurement unit and the leveler unit to control the gain applied to the audio signals by the leveler unit based on the level of diffusivity of the sounds present therein,
    wherein the controller is configured to determine whether the measured level of diffusivity exceeds a predetermined threshold,
    and
    wherein the controller is configured to, in response to determining that the measured level of diffusivity exceeds the predetermined threshold, either i) set the gain applied to the audio signals to a value of 1 or ii) cause the audio signals to bypass the leveler unit thereby avoiding the application of any gain to the audio signals.

2. A sound processing system according to claim 1, wherein the level of diffusivity of the sound present in the audio signal is determined as a value between 0 and 1, with 0 representing a sound which is purely directional and 1 representing a sound that is totally diffuse.

3. A sound processing system according to claim 2, wherein the controller compares the determined value representative of the level of diffusivity of the sound present in the audio signal against a predetermined threshold value and if the determined value is greater than the predetermined threshold value, the level of diffusivity of the sounds present within the audio signal is determined as being high and no gain is applied to the audio signal by the leveler unit.

4. A sound processing system according to claim 2, wherein the controller compares the determined value representative of the level of diffusivity of the sound present in the audio signal against a predetermined threshold value and if the determined value is lower than the predetermined threshold value, the level of diffusivity of the sounds present within the audio signal is determined as being low and the gain is applied to the audio signal by the leveler unit.

5. A sound processing system according to claim 2, wherein the controller employs the determined value representative of the level of diffusivity of the sound present in the audio signal to vary a timing function of the leveler unit.

6. A sound processing system according to claim 1, wherein the plurality of input channels is generated by one or more microphone units present within the audio scene.

7. A sound processing system according to claim 1, wherein the audio signals received from the plurality of input channels are passed through a bandpass filter to generate a plurality of bands for each frame of the audio signal.

8. A sound processing system according to claim 7, wherein the diffusivity measurement unit calculates a covariance matrix for each of the plurality of bands of each frame of the audio signal.

9. A sound processing system according to claim 8, wherein the diffusivity measurement unit further processes the covariance matrix by performing an eigen decomposition function to obtain the level of diffusivity of each band of the frame of audio signal.

10. A sound processing system according to claim 9, wherein a broadband diffusivity measure is generated by the diffusivity measurement system for each frame of audio signal by summing the level of diffusivity for each band in the frame of audio signal and this broadband diffusivity measure is supplied to the controller to control the gain applied to the frame of audio signal by the leveler unit.

11. A sound processing system according to claim 9, wherein the level of diffusivity of each band of the frame of audio signal is supplied to the controller to control the gain applied to the bands of the frame of audio signals by the leveler unit.

12. A sound processing unit according to claim 1, wherein the leveler unit is an Automatic Gain Control (AGC) circuit.

13. A method for processing audio signals obtained from an audio scene including at least one target sound in the presence of background noise, including:
    receiving the audio signals from a plurality of input channels;
    band filtering the audio signals to create a plurality of individual frequency bands forming a segment of the audio signal;
    calculating a diffusivity measurement for the sound present in each individual frequency band and processing the calculated diffusivity measurements to determine a level of diffusivity for the segment of the audio signal;
    comparing the level of diffusivity for the segment of audio signal against a predetermined level to determine whether the segment of audio signal contains diffuse sound;
    in the event that the level of diffusivity of the segment is equal to or below the predetermined level, applying levelling to the segment of audio signal to minimize variations in the audio signal levels;
    in the event that the level of diffusivity of the segment is determined as being above the predetermined level, either bypassing any levelling of the segment of audio signal or applying levelling with a gain value of 1 to the segment of audio signal; and
    generating one or more output channels.

14. A method according to claim 13, wherein the audio signals are received from one or more microphone units present within the audio scene.

15. A method according to claim 13, wherein the step of calculating the diffusivity measurement for the sound present in each frequency band includes generating a covariance matrix for each individual frequency band and performing eigen decomposition on the generated covariance matrices.

16. A method according to claim 15, wherein the level of diffusivity for the segment of audio signal includes summing the calculated diffusivity measurement in each individual frequency band to generate a broadband level of diffusivity for the segment of audio signal.

17. A method according to claim 13, wherein the levelling is applied to the segment of audio signal by an AGC circuit.

18. A non-transitory machine-readable medium coded with instructions, that when executed by a processing system in a receiving endpoint, carry out the method recited in claim 13.

19. A method according to claim 13, wherein the level of diffusivity of the sound present in the segment of the audio signal is determined as a value between 0 and 1, with 0 representing a sound which is purely directional and 1 representing a sound that is totally diffuse.

20. A method according to claim 19, wherein the determined value representative of the level of diffusivity of the sound present in the segment of the audio signal is compared against a predetermined threshold value and if the determined value is greater than the predetermined threshold value, the level of diffusivity of the sounds present within the segment of the audio signal is determined as being high and no gain is applied to the segment of the audio signal.

21. A method according to claim 19, wherein the determined value representative of the level of diffusivity of the sound present in the segment of the audio signal is compared against a predetermined threshold value and if the determined value is lower than the predetermined threshold value, the level of diffusivity of the sounds present within the segment of the audio signal is determined as being low and the gain is applied to the segment of the audio signal.

22. A method according to claim 19, wherein the determined value representative of the level of diffusivity of the sound present in the segment of the audio signal is used to vary a timing for applying the leveling.

23. A method according to claim 13, wherein the step of calculating the diffusivity measurement for the sound present in each frequency band includes generating a covariance matrix for each individual frequency band.

* * * * *